(12) United States Patent
Ueno et al.

(10) Patent No.: US 7,254,068 B2
(45) Date of Patent: Aug. 7, 2007

(54) SEMICONDUCTOR MEMORY DEVICE

(75) Inventors: Hiroki Ueno, Kokubunji (JP); Takashi Akioka, Akishima (JP); Kinya Mitsumoto, Tmamura (JP); Akihisa Aoyama, Kokubunji (JP); Masao Shinozaki, Higashimurayama (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 11/375,060

(22) Filed: Mar. 15, 2006

(65) Prior Publication Data

US 2006/0158918 A1    Jul. 20, 2006

Related U.S. Application Data

(63) Continuation of application No. 11/046,690, filed on Feb. 1, 2005, now Pat. No. 7,068,551, which is a continuation of application No. 10/637,549, filed on Aug. 11, 2003, now Pat. No. 6,856,559, which is a continuation of application No. 10/011,488, filed on Dec. 11, 2001, now Pat. No. 6,625,070.

(30) Foreign Application Priority Data

Dec. 19, 2000 (JP) ............................. 2000-386087

(51) Int. Cl.
*G11C 7/00* (2006.01)
(52) U.S. Cl. ...................................... 365/198; 365/206
(58) Field of Classification Search ................ 365/198, 365/206
See application file for complete search history.

(56) References Cited

U.S. PATENT DOCUMENTS

| | | | |
|---|---|---|---|
| 4,941,031 A | 7/1990 | Kumagai et al. ............. 357/45 |
| 5,170,243 A | 12/1992 | Dhong et al. ................ 365/208 |
| 5,179,427 A | 1/1993 | Nakayama et al. .......... 257/211 |
| 5,292,678 A | 3/1994 | Dhong et al. .................. 437/50 |
| 5,625,234 A | 4/1997 | Suzuki et al. ................ 257/773 |
| 6,088,283 A | 7/2000 | Hayashi .................. 365/230.03 |
| 6,493,394 B2 | 12/2002 | Tamura et al. .............. 375/257 |

(Continued)

FOREIGN PATENT DOCUMENTS

JP        64-14954        1/1989

(Continued)

OTHER PUBLICATIONS

Prince, Betty, "Semiconductor Memories", 1983, Wiley, 2nd edition, pp. 286-287.

*Primary Examiner*—Michael Tran
(74) *Attorney, Agent, or Firm*—Miles & Stockbridge P.C.

(57) ABSTRACT

Parasitic capacitances formed between bit lines to which signals are to be read out of memory cells and a signal transmission line arranged above them are to be reduced. Second complementary global bit lines for transmitting data read out of memory cells MC via complementary bit lines are arranged above a memory cell array. Each second global bit line is so arranged that a triangle having as its vertexes the center of the section of one of the complementary bit lines, that of the section of the other and that of the section of the second global bit line arranged directly above these complementary bit lines be an isosceles triangle.

3 Claims, 18 Drawing Sheets

U.S. PATENT DOCUMENTS

| | | |
|---|---|---|
| 6,756,652 B2 | 6/2004 | Yano et al. .................. 257/508 |
| 6,804,304 B1 | 10/2004 | Chan .......................... 375/257 |
| 6,859,883 B2 | 2/2005 | Svestka et al. ............. 713/320 |
| 6,888,776 B2 | 5/2005 | Watanabe et al. ...... 365/230.06 |
| 6,894,231 B2 | 5/2005 | Winograd et al. .......... 174/261 |
| 2004/0000841 A1* | 1/2004 | Phelps et al. ................ 310/314 |
| 2004/0002656 A1* | 1/2004 | Sheljaskow et al. ........ 600/459 |
| 2004/0078615 A1* | 4/2004 | Martin et al. ............... 713/500 |
| 2005/0257121 A1* | 11/2005 | Kim et al. ................... 714/768 |
| 2006/0082383 A1* | 4/2006 | Choi ............................ 326/30 |

FOREIGN PATENT DOCUMENTS

| | | |
|---|---|---|
| JP | 5-218348 | 8/1993 |
| JP | 7-45722 | 2/1995 |
| JP | 7-58215 | 3/1995 |
| JP | 10-289987 | 10/1998 |

* cited by examiner

SEMICONDUCTOR MEMORY DEVICE

CROSS-REFERENCE TO RELATED APPLICATION

This application is a continuation of application Ser. No. 11/046,690 filed Feb. 1, 2005 (now U.S. Pat. No. 7,068,551), which is a continuation of application Ser. No. 10/637,549 filed Aug. 11, 2003 (now U.S. Pat. No. 6,856,559), which is a continuation of application Ser. No. 10/011,488 filed Dec. 11, 2001 (now U.S. Pat. No. 6,625,070).

BACKGROUND OF THE INVENTION

The present invention relates to a wiring layout technique for semiconductor memory devices, and more particularly to a technique effectively applicable to attempts at reducing parasitic capacitances formed between bit lines for reading signals out of memory cells and a signal transmission line arranged on a layer above them.

Japanese Unexamined Patent Publication No. Hei 7(1995)-58215 (corresponding U.S. Pat. No. 5,625,234) discloses a wiring method for dynamic random access memories (DRAMs) (method of arranging bit lines and Y select lines).

Usually, a DRAM uses a wiring system by which Y select lines for selecting column addresses are arranged on a layer above bit lines and extend in parallel to the bit lines. However, as this wiring system entails large parasitic capacitances between the Y select lines and the bit lines, any variation in potential on the Y select lines would work in an unbalanced way on bit line pairs (bit line/complement bit line), and might destabilize the sensing of stored information from memory cells.

In view of this problem, according to the above cited patent application, Y select lines are arranged at equal distances to bit line pairs to equalize the parasitic capacitances of the bit line pairs against the Y select lines and thereby to reduce the adverse effect on the bit lines. In this wiring structure, as parasitic capacitances between Y select lines and nearby bit line pairs are balanced, sensing of stored information from memory cells can be accomplished steadily and reliably. However, even where this wiring structure is used, there is an undeniable imbalance of parasitic capacitances for other bit lines adjoining the noted bit lines. Therefore, for such adjoining bit lines, the parasitic capacitances against Y select lines are substantially equalized by twisting the bit line pairs midway on the Y select lines. Regarding the configuration of bit lines, reference may be made to Japanese Unexamined Patent Publication No. Sho 64(1989)-14954, Japanese Unexamined Patent Publication No. Hei 10(1998)-289987 (corresponding U.S. Pat. No. 6,088,283), Japanese Unexamined Patent Publication No. Hei 7(1995)-45722 and Japanese Unexamined Patent Publication No. Hei 5(1993)-218348 (corresponding U.S. Pat. Nos. 5,170,243 and 5,292,678).

SUMMARY OF THE INVENTION

The present inventor has studied a technique for reducing the chip area of static random access memories (SRAMs).

A SRAM amplifies with a sense amplifier circuit signals read out of memory cells through bit lines, and outputs them over a signal transmission line. Usually such a signal transmission line is arranged on the wiring channels of peripheral circuits and laid in a chip all around.

However, in order to compress the chip area of a SRAM to reduce its cost, it is required also to compress the area of wiring channels along with reducing the memory cell size infinitesimally. While a conceivable way to meet this requirement is to arrange a signal transmission line, which would otherwise be arranged on wiring channels, on a memory cell array, but if the signal transmission line is arranged over bit lines formed on the memory cell array, parasitic capacitances will be formed between the bit lines and the signal line extending in parallel to them.

From a SRAM, only a small amplitude is outputted on bit lines by the capacities of memory cells, and amplification by the sense amplifier results in no signal amplification on the bit lines. Therefore, if signal transmission wiring passes over bit lines on which the signal amplitude is always small, the timing of any variation in the signal level on this signal transmission line coincides with the activity of the bit lines, parasitic capacitances formed between the signal transmission line and the bit lines may adversely affect the bit lines and invite erroneous actions.

An object of the present invention is to provide a technique for reducing the chip area of semiconductor memory devices.

Another object of the invention is to provide a technique for reducing parasitic capacitances formed between bit lines for reading signals out of memory cells and a signal transmission line arranged in a layer above them.

These and other objects and novel features of the invention will become apparent from the following description in this specification when taken in conjunction with the accompanying drawings.

What follows is a brief summary of typical aspects of the invention disclosed in this application.

In a semiconductor memory device according to one aspect of the invention, a signal transmission line is arranged over a memory cell array. By laying out this arrangement so that a signal transmission line extending in a layer above a pair of complementary bit lines in parallel to the bit lines be at equal distances to the bit line and the complement bit line directly underneath them, the capacitance between the signal transmission line and the bit line can be substantially equalized to the capacitance between the signal transmission line and the complement bit line.

In a semiconductor memory device according to another aspect of the invention, by bending a signal transmission line above complementary bit lines near the center of the length of the complementary bit lines and arranging it over other complementary bit lines, other bit lines than the complementary bit lines directly underneath the signal transmission line can have capacitances substantially balanced with the signal transmission line.

DETAILED DESCRIPTION OF THE PREFERRED EMBODIMENTS

Preferred embodiment of the present invention will be described in detail below with reference to the accompanying drawings. In all the drawings to be referred to in describing the embodiments of the invention, constituent elements having the same functions will be assigned respectively the same reference signs, and their description will not be repeated.

Embodiment 1

Figure 1:
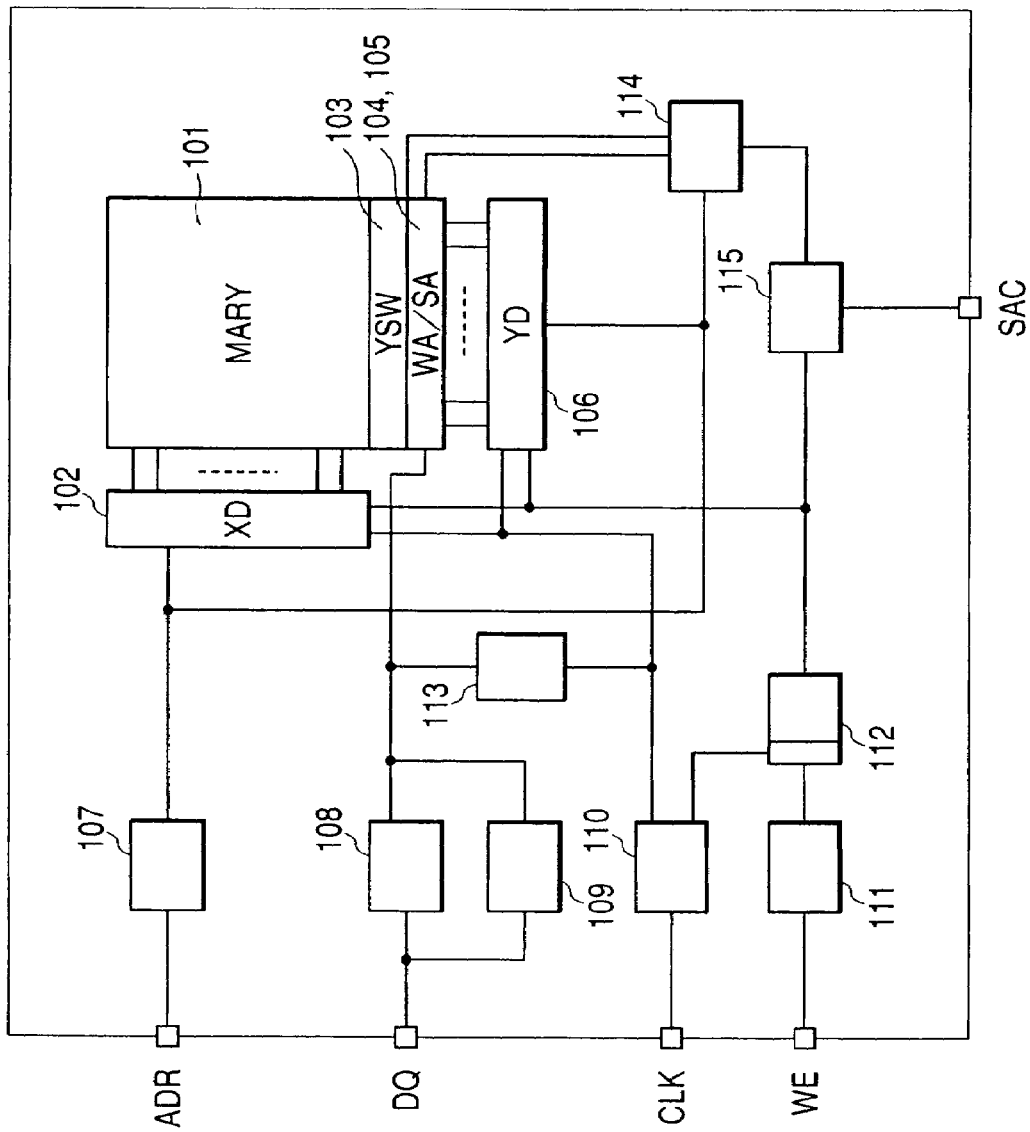
FIG. 1 is a block diagram of a SRAM, which is a preferred embodiment of the present invention.

FIG. 1 is a block diagram of a static random access memory (SRAM), which is a preferred embodiment of the invention. This SRAM, which is a high-speed SRAM having a memory capacity of 8 megabits (Mbits) for use as a cache memory for a work station for instance, is configured of a memory cell array (MARY) 101, in which a plurality of memory cells are formed, and peripheral circuits arranged around the MARY 101. The peripheral circuits include an X decoder circuit (XD) 102, a Y select circuit (YSW) 103, a write amplifier circuit (WA) 104, a sense amplifier circuit (SA) 105, a Y decoder circuit (YD) 106, an address input buffer circuit 107, a data input buffer circuit 108, a data output circuit 109, a clock input buffer circuit 110, a write enable input buffer circuit 111, a read/write signal generating circuit 112, a data bus equalize signal generating circuit 113, a circuit 114 for logical computation between a sense amplifier activity signal and an address signal, and a sense amplifier activity timing adjustment signal generating circuit 115.

Figure 2:
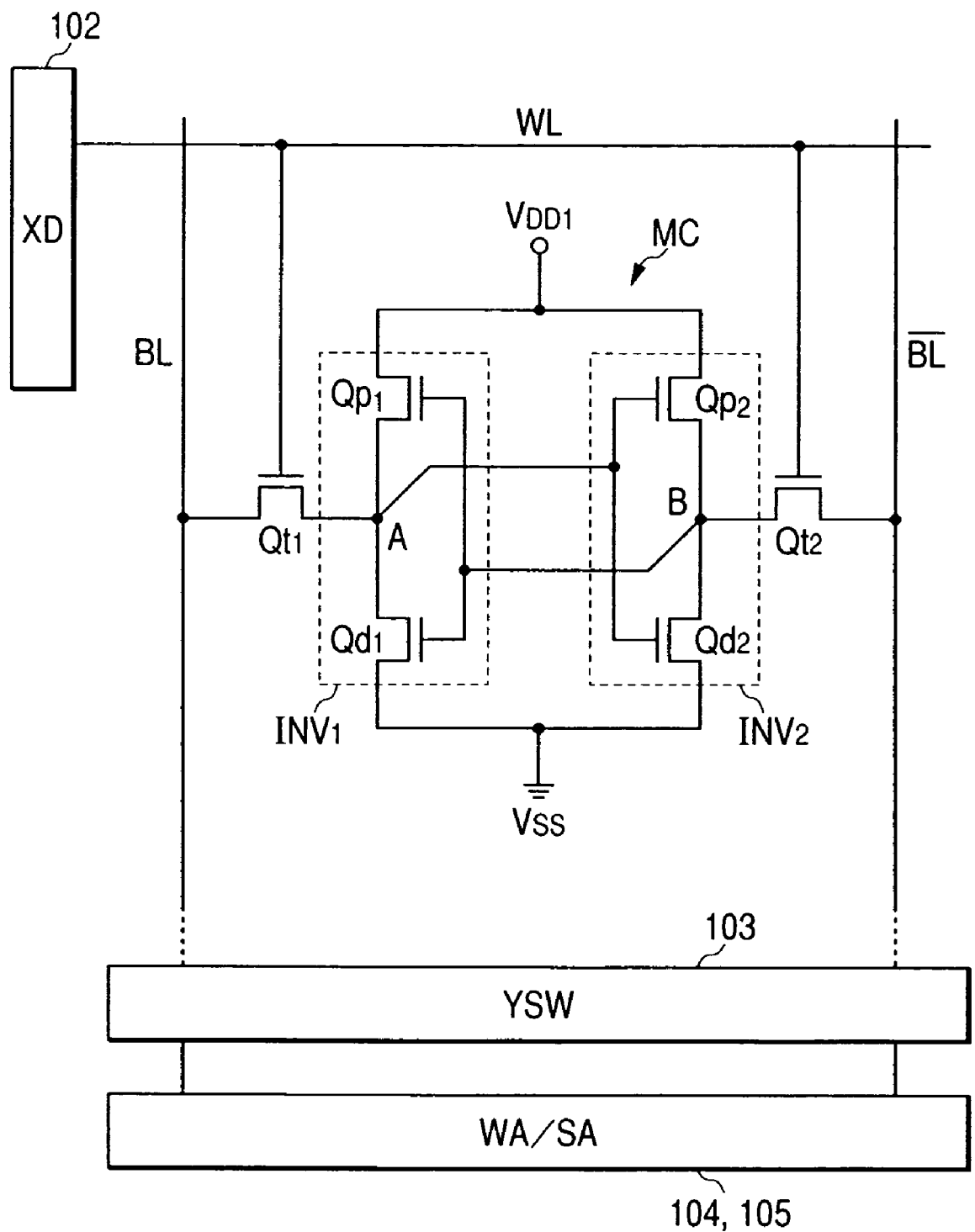
FIG. 2 illustrates an equalizing circuit for memory cells in the SRAM embodying the invention in this mode.

FIG. 2 illustrates an equalizing circuit for a memory cell MC formed in the memory cell array (MARY) 101. The memory cell MC consists of a pair of metal insulated semiconductor field effect transistors (MISFETs; which may be metal oxide semiconductor field effect transistors (MOSFETs)) for drive use ($Qd_1$ and $Qd_2$), a pair of MISFETs ($QP_1$ and $QP_2$) for loading use and a pair of MISFETs ($Qt_1$ and $Qt_2$) for transferring use, all arranged at intersections of a pair of complementary bit lines (BL and /BL) and a word line (WL). The drive MISFETs ($Qd_1$ and $Qd_2$) and the transfer MISFETs ($Qt_1$ and $Qt_2$) are composed of n-channel type MISFETs, while the load MISFETs ($QP_1$ and $QP_2$) consist of p-channel type MISFETs. Thus the memory cell is configured of a full CMOS type using four n-channel type MISFETs and two p-channel type MISFETs. A full CMOS type memory cell is less susceptible to current leaks during standby than a load resistance type memory cell using four n-channel type MISFETs and two high resistance load elements, and accordingly consumes less power.

Out of the six MISFETs constituting the memory cell, the drive MISFET $Qd_1$ and the load MISFET $Qp_1$ constitute a first inverter ($INV_1$), and the drive MISFET $Qd_2$ and the load MISFET $Qp_2$ constitute a second inverter ($INV_2$). These paired inverters ($INV_1$ and $INV_2$) are cross-connected within the memory cell MC, and constitute a flip-flop circuit as an information storage for storing one-bit information. One end of the flip-flop circuit (one each of the source and the drain of the two load MISFETs $Qp_1$ and $Qp_2$) is connected to an internal source voltage (VDDI) of 1.5 V for instance, while the other end (one each of the source and the drain of the two drive MISFETs $Qd_1$ and $Qd_2$) is connected to a reference voltage (Vss) of 0V for instance.

One of the input/output terminals of the flip-flop circuit is connected to one of the source and the drain of the transfer MISFET $Qt_1$, while the other of the input/output terminals is connected to one of the source and the drain of the transfer MISFET $Qt_2$. The gate electrodes of the transfer MISFETs ($Qt_1$ and $Qt_2$) are connected to the X decoder circuit (XD) 102 via the word line WL. The other one of the source and the drain of the transfer MISFET $Qt_1$ is connected to the bit line BL while the other one of the source and the drain of the transfer MISFET $Qt_2$ is connected to the bit line /BL. These complementary bit lines (BL and /BL) are connected to the write amplifier circuit (WA) 104 and the sense amplifier circuit (SA) 105 via the Y select circuit (YSW) 103.

The wiring which cross-connects the pair of inverters ($INV_1$ and $INV_2$) within the memory cell MC is formed of a first layer of metallic wiring. The complementary bit lines (BL and /BL) are formed of a second layer of metallic wiring arranged above the first layer of metallic wiring. Wiring for supplying the flip-flop circuit with the internal source voltage (VDDI) and the reference voltage (Vss) is formed of metallic wiring of the second layer. The word line WL, formed integrally with the gate electrodes of the transfer MISFETs ($Qt_1$ and $Qt_2$), consists of a polycrystalline silicon film for instance. The word line WL configured of a polycrystalline silicon film is connected to a third layer of metallic wiring (main word line), arranged above the second layer of metallic wiring, to reduce any wiring delay that may occur, and is connected to the X decoder circuit (XD) 102 via this main word line. The first through third layers of metallic wiring consist of Al alloy films, for instance.

Figure 3:
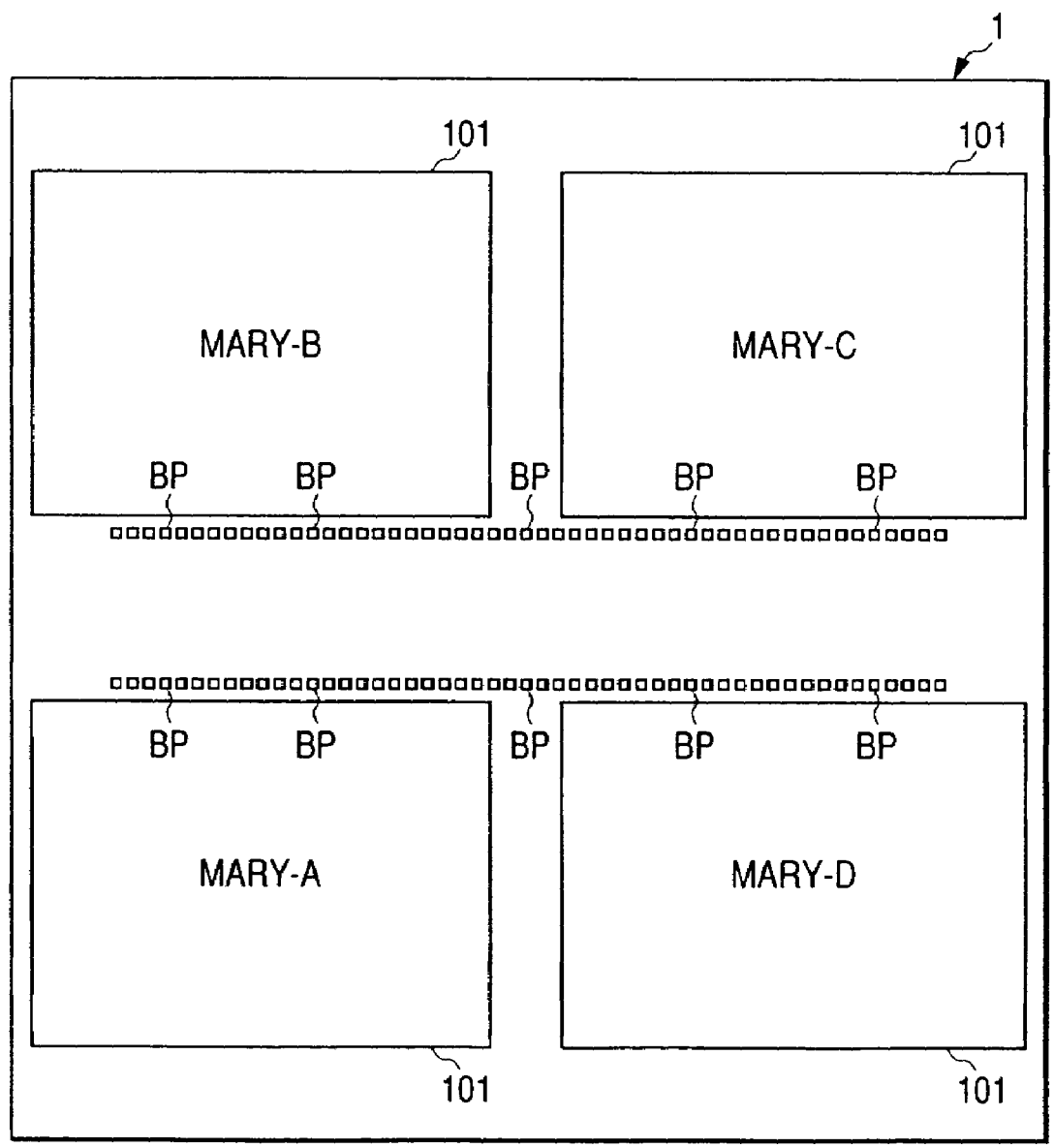
FIG. 3 is a plan of a silicon chip, illustrating the layout of a memory cell array in the SRAM embodying the invention in this mode.

FIG. 3 is a plan of a silicon chip 1, showing the layout of the memory cell array (MARY) 101. As illustrated, the memory cell array (MARY) 101 is divided into four memory cell arrays (MARY-A through MARY-D) each having a memory capacity of 2 Mbits. Around these four memory cell arrays (MARY-A through MARY-D) are arranged the peripheral circuits shown in FIG. 1 and a plurality of bonding pads BP (external connection terminals) including an address input pad ADR, a data input/output pad DQ, a clock input pad CLK and a write enable input pad WE.

Figure 4:
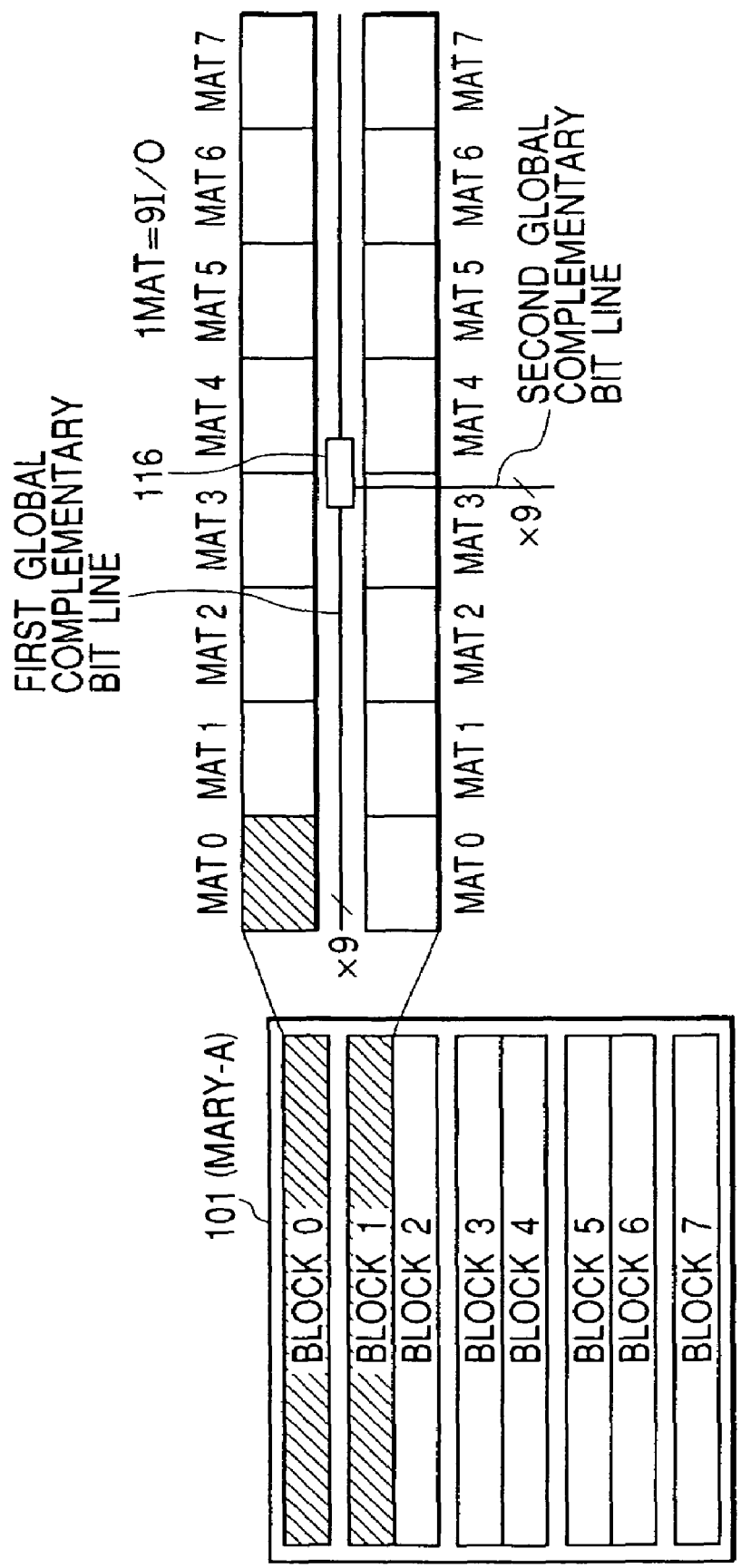
FIG. 4 is an expanded block diagram of the memory cell array shown in FIG. 3.

FIG. 4 is an expanded block diagram of the memory cell array (MARY-A). As illustrated, the memory cell array (MARY-A) is divided into eight memory cell arrays (BLock 0 through BLock 7), each having a memory capacity of 250 kilobits (Kbits). Each of these eight memory cell arrays (BLock 0 through BLock 7) is further divided into eight MATs (MAT 0 through MAT 7). Though not illustrated, each of the other three memory cell arrays (MARY-B through MARY-D) is also divided into eight memory cell arrays (BLock 0 through BLock 7), and each of these eight memory cell arrays (BLock 0 through BLock 7) is further divided into eight MATs (MAT 0 through MAT 7).

Figure 5:
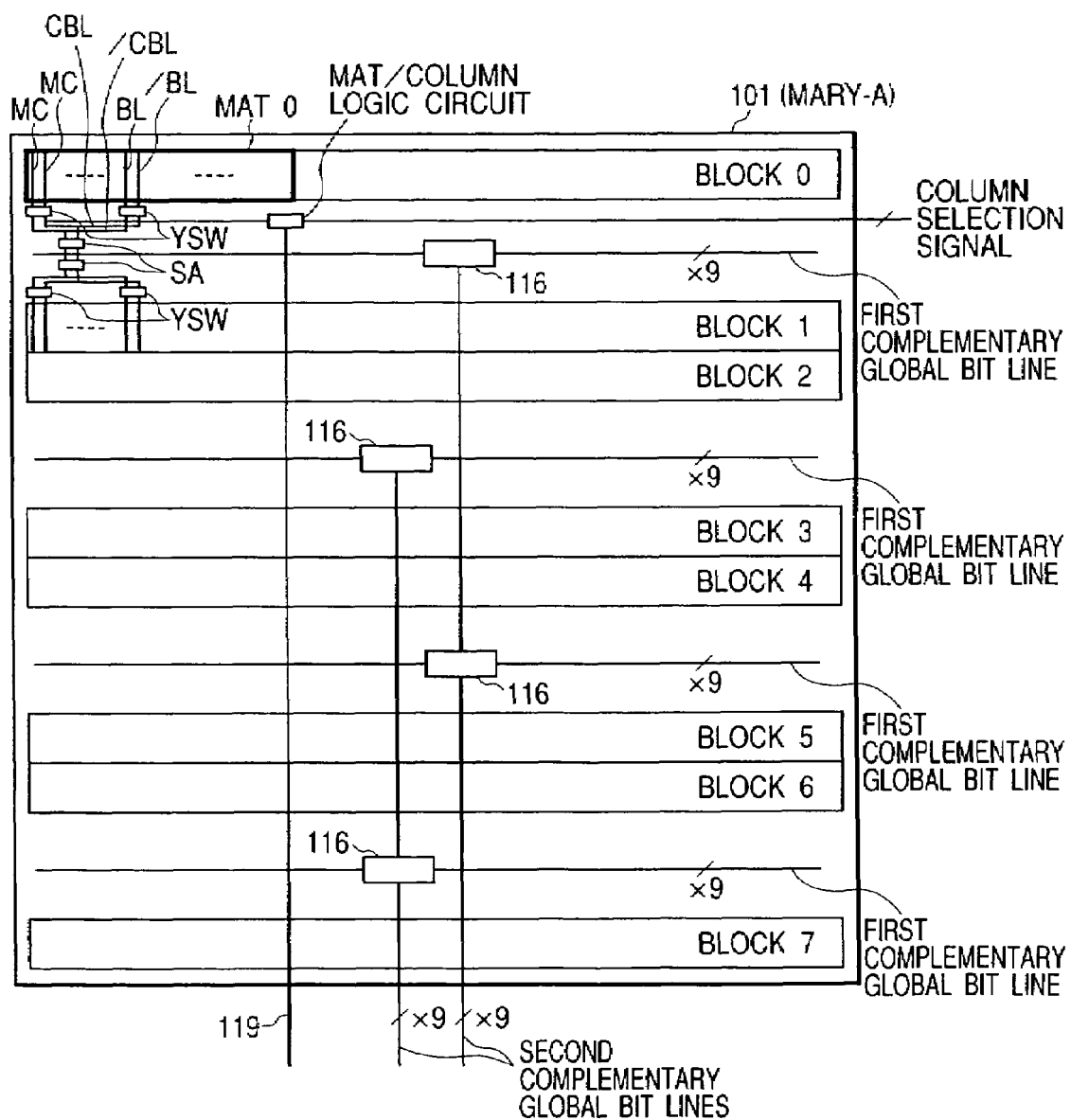
FIG. 5 is a further expanded block diagram of the memory cell array shown in FIG. 4.
Figure 6:
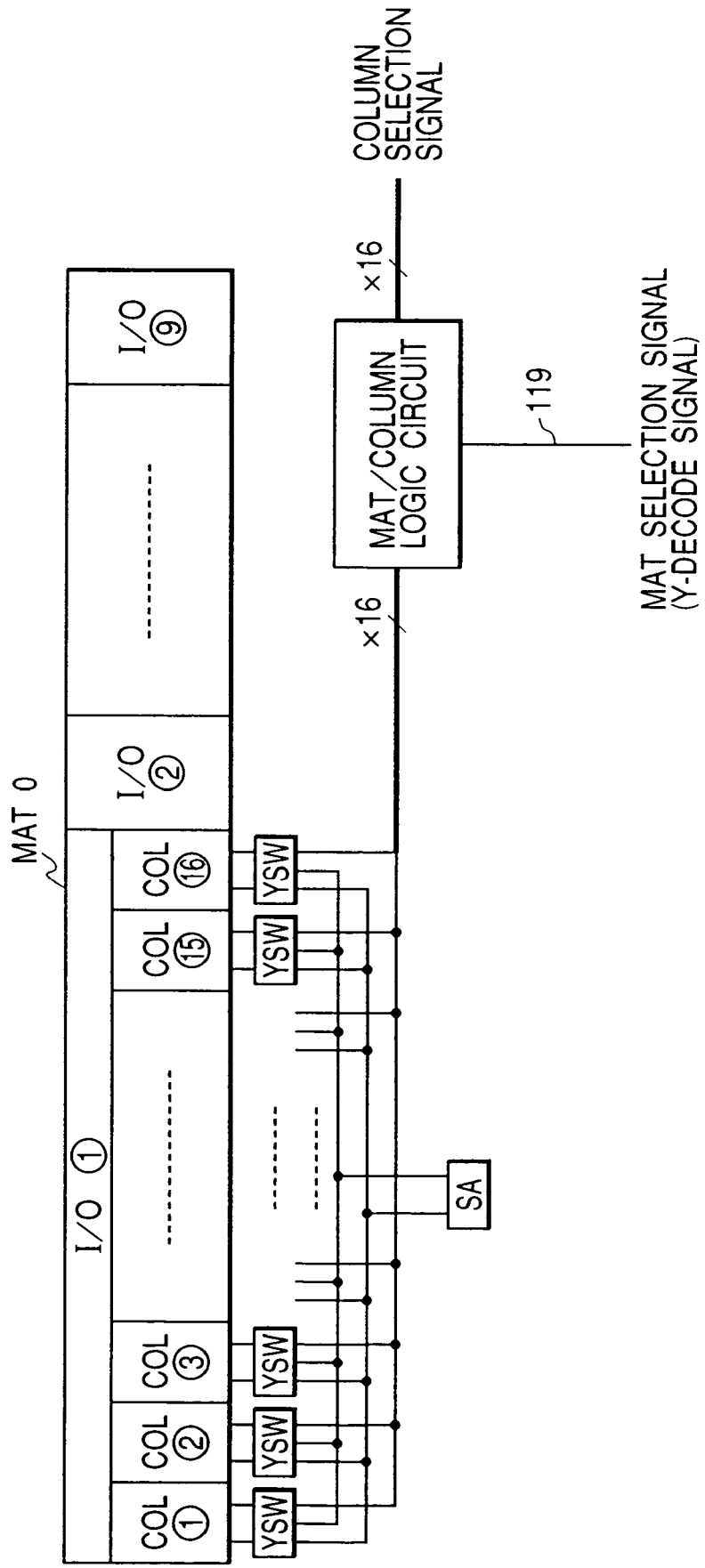
FIG. 6 is an expanded block diagram of a MAT of the memory cell array shown in FIG. 4.
Figure 7:
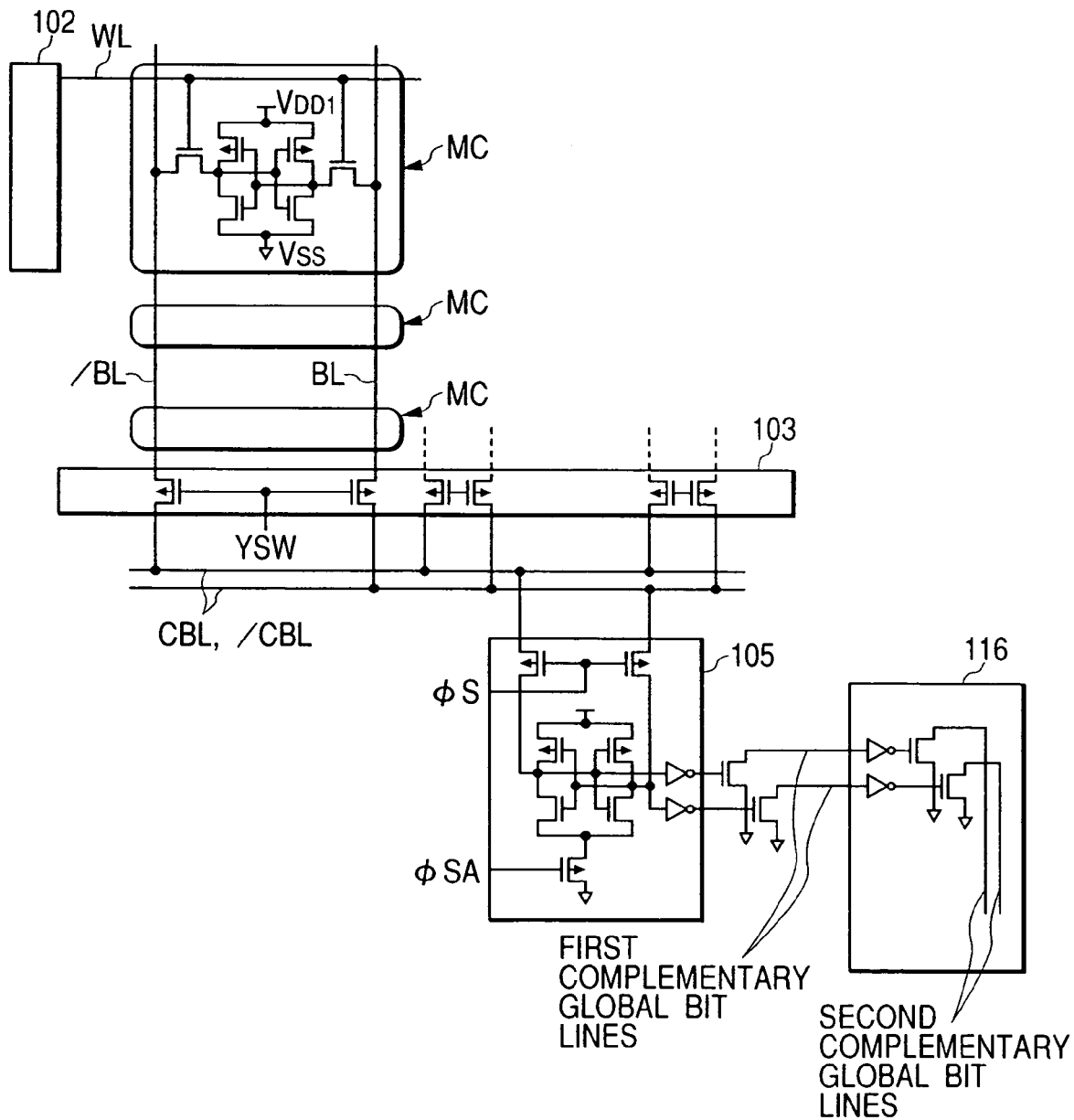
FIG. 7 is a diagram of the MAT shown in FIG. 6 and circuits peripheral thereto.
Figure 8:
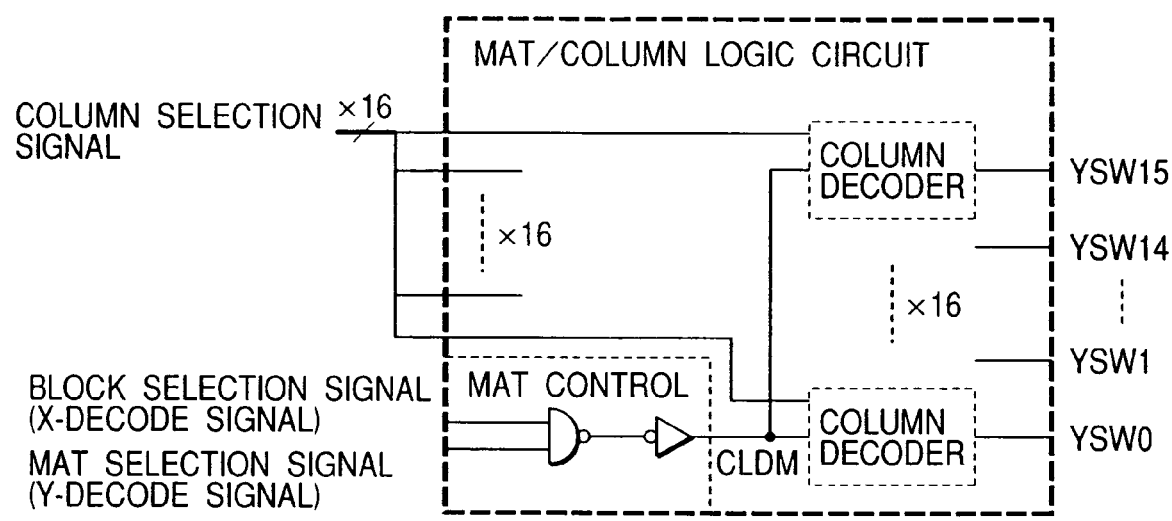
FIG. 8 is a diagram of the MAT/COLUMN logic circuit connected to the MAT shown in FIG. 6.
Figure 9:
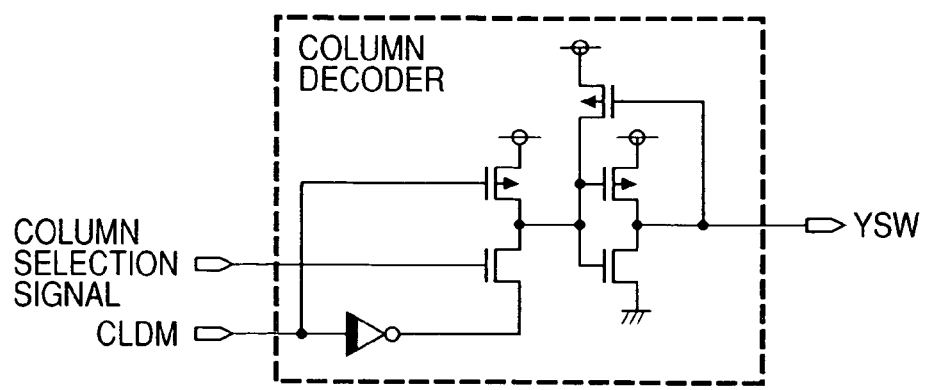
FIG. 9 is a diagram of the column decoder circuit in the MAT/COLUMN logic circuit shown in FIG. 8.

FIG. 5 is a further expanded block diagram of the memory cell array (MARY-A) divided into the eight memory cell arrays (BLock 0 through BLock 7); FIG. 6, an expanded block diagram of one (MAT 0) of the eight MATs (MAT 0 through MAT 7) in the memory cell array (BLock 0); FIG. 7, a diagram of the MAT (MAT 0) and peripheral circuits in its vicinities (the X decoder circuit (XD) 102, the Y select circuit (YSW) 103, the sense amplifier circuit (SA) 105 and a data bus buffer circuit 116); FIG. 8, a diagram of a MAT/COLUMN logic circuit 117 connected to the MAT (MAT 0); and FIG. 9, a diagram of a column decoder circuit 118 in the MAT/COLUMN logic circuit 117.

As illustrated in FIG. 6, the MAT (MAT 0) in the memory cell array (BLock 0) is divided into nine I/O blocks, each of which is further divided into 16 columns (COL). Though not shown, the other seven MATs (MAT 1 through MAT 7) is also divided into nine I/O blocks, each of which is further divided into 16 columns (COL).

As shown in FIG. 7, in each of the 16 columns (COL), a pair of complementary bit lines (BL and /BL) to which a plurality of memory cells MC are connected extends in the column direction, and to the ends of these complementary bit lines (BL and /BL) is connected the Y select circuit (YSW) 103.

Data from the memory cell MC selected by the word line WL are transmitted to a pair of complementary common bit lines (CBL and /CBL) via the complementary bit lines (BL and /BL) and a Y selection switch of the Y select circuit (YSW) 103 connected thereto. Data from the memory cell MC transmitted to the complementary common bit lines (CBL and /CBL), after being amplified by the sense amplifier circuit 105, are transmitted to the data bus buffer circuit 116 via a pair of first complementary global bit line (GBL and /GBL), and further supplied to the data output circuit 109 shown in FIG. 1 via a pair of second complementary global bit lines (GBL and /GBL) connected to the data bus buffer circuit 116. To the complementary common bit lines (CBL and /CBL) is connected the MAT/COLUMN logic circuit 117, and with a column (Y) selection signal and a MAT selection signal supplied to this circuit is controlled the column decoder circuit 118 to select a prescribed MAT and a prescribed column (COL) within it.

As shown in FIG. 5, a wiring channel is provided between the memory cell array (BLock 0) and the memory cell array (BLock 1) adjacent thereto. In this wiring channel are arranged the aforementioned Y select circuit (YSW) 103, complementary common bit lines (CBL and /CBL), sense amplifier circuit 105, MAT/COLUMN logic circuit 117, wiring for transmitting the column (Y) selection signal to this circuit (117), and the complementary first global bit lines (GBL and /GBL). Though not wholly shown, in this wiring channel are also arranged the Y select circuit (YSW) 103 connected to the complementary bit lines (BL and /BL) of the memory cell array (Block 1), complementary common bit lines (CBL and /CBL), sense amplifier circuit 105, MAT/COLUMN logic circuit 117, and wiring for transmitting the column (Y) selection signal to this circuit (117). The complementary common bit lines (CBL and /CBL), wiring for transmitting the column (Y) selection signal to the MAT/COLUMN logic circuit 117, and complementary first global bit lines (GBL and /GBL) are configured of metallic wiring of the third layer extending in this wiring channel in the row direction.

On the other hand, wiring 119 for supplying the MAT selection signal to the MAT/COLUMN logic circuit 117 and the second complementary global bit lines (GBL and /GBL) connected to the data bus buffer circuit 116 are configured of metallic wiring of a fourth layer crossing the upper part of the memory cell arrays (Block 1 through Block 7) and extending in the column direction.

Similarly, wiring channels are provided between the memory cell array (BLock 2) and the memory cell array (BLock 3) adjoining it, between the memory cell array (BLock 4) and the memory cell array (BLock 5) adjoining it, and between the memory cell array (BLock 6) and the memory cell array (BLock 7) adjoining it. In each of these wiring channels are arranged circuits similar to those in the above-described wiring channel between the memory cell array (BLock 0) and the memory cell array (BLock 1) adjoining it and the third layer metallic wiring.

To the MAT/COLUMN logic circuit 117 formed in each of these wiring channels is connected wiring 119 for supplying a MAT selection signal to this circuit (117), and to the data bus buffer circuit 116 are connected the second complementary global bit lines (GBL and /GBL). The wiring 119 for supplying the MAT selection signal to the MAT/COLUMN logic circuit 117 and the second complementary global bit lines (GBL and /GBL) connected to the data bus buffer circuit 116 are configured of a fourth layer of metallic wiring crossing the upper parts of other memory cell arrays (BLocks) and extending in the column direction.

Thus, in the SRAM embodying the invention in this mode, out of the complementary first global bit lines (GBL and /GBL) and second complementary global bit lines (GBL and /GBL) for transmitting data read out of the memory cell MC via the complementary bit lines (BL and /BL), the second complementary global bit lines (GBL and /GBL) configured of the fourth layer of metallic wiring extending in the column direction are arranged above the memory cell array (BLock).

As this arrangement makes it possible to reduce the area of wiring channels, the area of the silicon chip on which the SRAM is formed can also be reduced. Moreover, as the wiring length can be made shorter than where the second complementary global bit lines (GBL and/GBL) are drawn over the wiring channels, signal delays are reduced to enable data to be read out at higher speed.

As stated above, where the second complementary global bit lines (GBL and /GBL) are arranged in the upper part of the memory cell array (BLock) and extend in the column direction, the complementary bit lines (BL and /BL) extending in the column direction in the memory cell array (BLock) are in parallel to the second complementary global bit lines (GBL and /GBL), resulting in increased parasitic capacitances between the complementary bit lines (BL and /BL) and the second complementary global bit lines (GBL and /GBL).

As a consequence, if the signal level on second complementary global bit lines (GBL and /GBL) positioned close to these complementary bit lines (BL and /BL) varies when signals are being read out of a plurality of memory cells MC connected to a selected word line WL to the complementary bit lines (BL and /BL), that variation in potential may adversely affect the complementary bit lines (BL and /BL) via parasitic capacitances and reduce the amplitude thereon, and this might invite a longer access time or an erroneous action.

Figure 10:
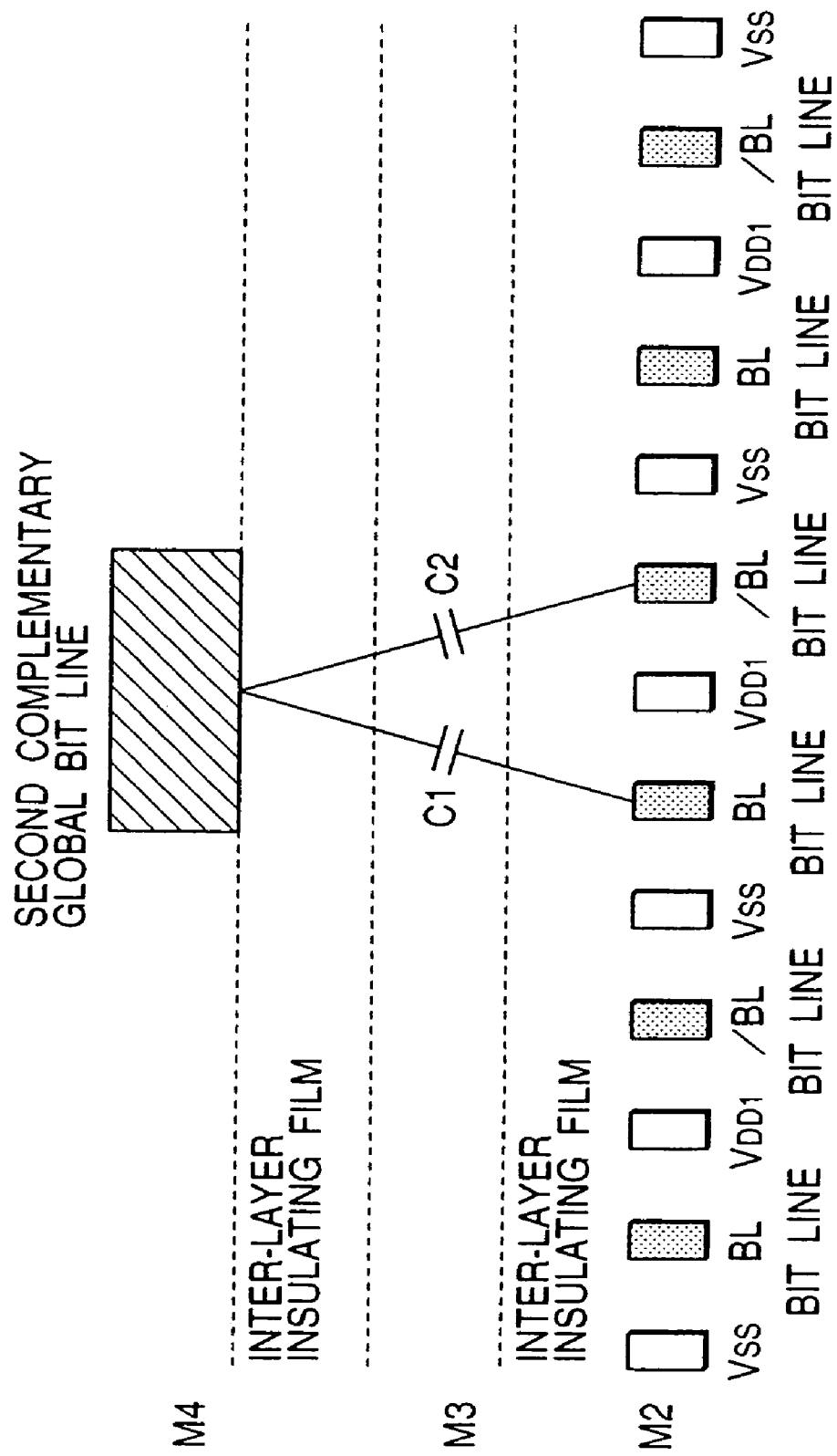
FIG. 10 is a virtual section showing the positional relationship between complementary bit lines and nearby second complementary global bit lines as viewed from a plane normal to a substrate over which a memory cell array is formed.

FIG. 10 shows the positional relationship between complementary bit lines (BL and /BL) and nearby second complementary global bit lines (GBL and /GBL) as viewed from a plane normal to the substrate over which a memory cell array (BLock) is formed.

In this embodiment, as a preventive measure against erroneous actions attributable to parasitic capacitances formed between the complementary bit lines (BL and /BL) and the second complementary global bit lines (GBL and /GBL), the distances between a second global bit line (GBL or /GBL) which constitutes the fourth layer of wiring and complementary bit lines (BL and /BL) positioned directly underneath, which constitute the second layer of wiring, are equalized. Thus in a virtual section normal to the main face of the substrate, the second global bit lines (GBL or /GBL) are so arranged that a triangle having as its vertexes the center of the section of one (BL) of the complementary bit lines (BL and /BL), that of the section of the other (/BL) and that of the section of the second global bit line (GBL or /GBL) arranged directly above these complementary bit lines (BL and /BL) be an isosceles triangle.

In this arrangement, a capacitance (C1) formed between one (BL) of the complementary bit lines (BL and /BL) and the second global bit line (GBL or /GBL) and another capacitance (C2) formed between the other (/BL) of the complementary bit lines (BL and /BL) and the second global bit line (GBL or /GBL) are substantially equal to each other at 1 (C1≈C2). This results in substantial balancing of the parasitic capacitances between the second global bit line (GBL or /GBL) and the complementary bit lines (BL and /BL) directly underneath, making it possible to prevent any longer access time or any erroneous action from occurring.

Even if the above-described preventive measure is taken, any other bit line (BL or /BL) than the complementary bit lines (BL and /BL) positioned directly underneath the second global bit lines (GBL or /GBL) may have an unbalanced capacitance vis-a-vis the second global bit line (GBL or /GBL). This capacitance, though smaller than the capacitance formed between the second global bit line (GBL or /GBL) and the complementary bit lines (BL and /BL) directly underneath, may be large enough to invite a longer access time or some other trouble.

Figure 11:
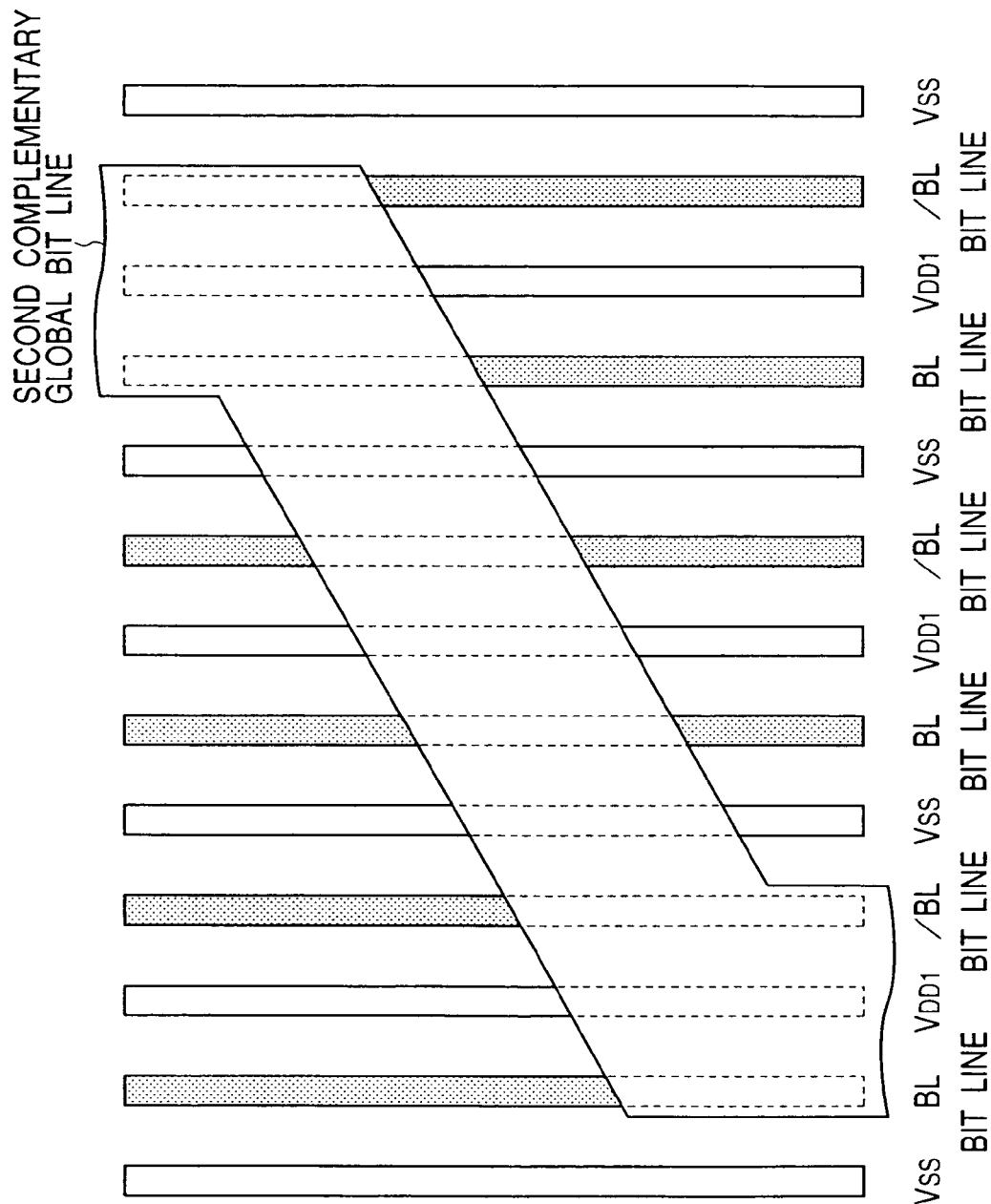
FIG. 11 is a plan showing part of the second complementary global bit lines.

To prevent this possible trouble, as shown in FIG. 11, the complementary second global bit lines (GBL and /GBL) are bent about at the center of the complementary bit lines (BL and /BL) and arranged over the other complementary bit lines (BL and /BL). In this way, other bit lines (BL or /BL) than the complementary bit lines (BL and /BL) positioned directly underneath the second global bit line (GBL or /GBL) have substantially balanced capacitances vis-a-vis the second global bit lines (GBL or /GBL), and therefore it is made possible to prevent more securely any longer access time or any erroneous action from occurring.

Figure 12:
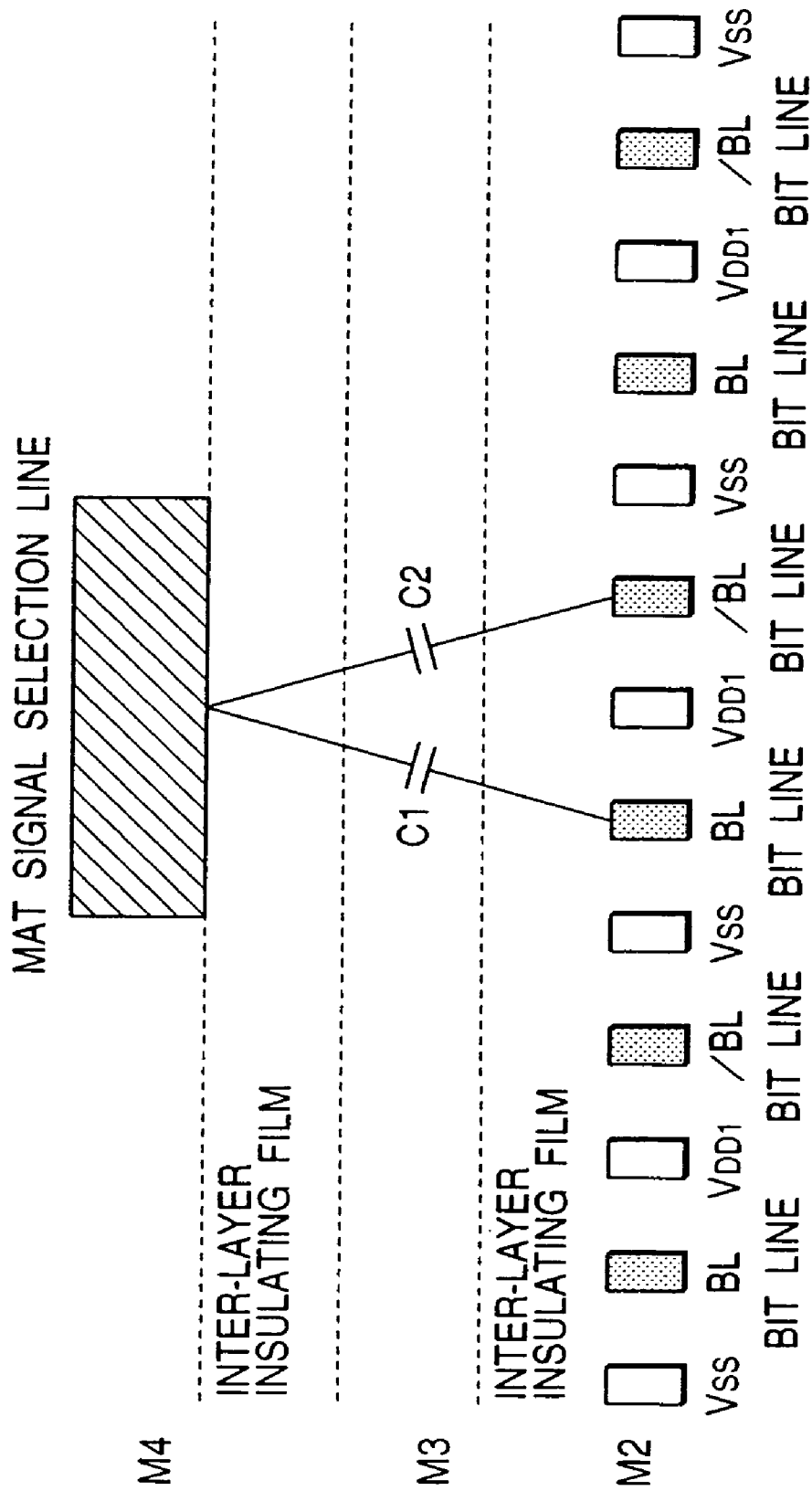
FIG. 12 is a virtual section showing the positional relationship between complementary bit lines and nearby MAT selection signal wiring as viewed from a substrate over which a memory cell array is formed.
Figure 13:
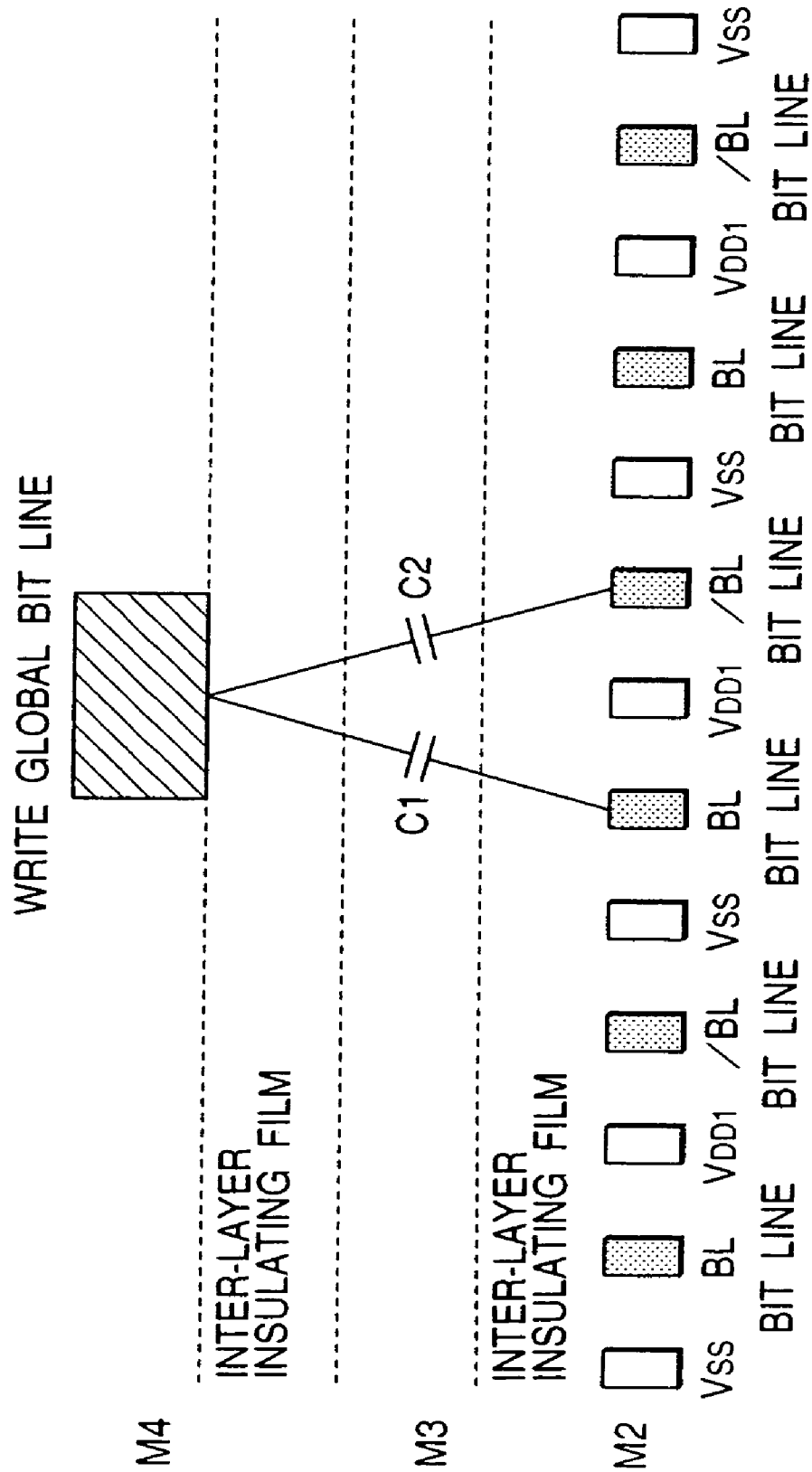
FIG. 13 is a virtual section showing the positional relationship between complementary bit lines and nearby global bit lines as viewed from a substrate over which a memory cell array is formed.

As described above, whereas the second complementary global bit lines (GBL and /GBL) configured of the fourth layer of metallic wiring extending in the column direction are arranged above the memory cell array (BLock) in this embodiment, the fourth layer of metallic wiring extending in the column direction also contains, in addition to the complementary second global bit lines (GBL and /GBL), the wiring 119 for supplying the MAT selection signal to the MAT/COLUMN logic circuit 117 and global bit lines for writing data into the memory cell MC. Therefore, as shown in FIG. 12 and FIG. 13, it is possible to substantially balance the parasitic capacitances between the complementary bit lines (BL and /BL) and the complementary second global bit lines (GBL and /GBL) by also arranging these wiring lines near the center of the complementary bit lines (BL and /BL).

Embodiment 2

Figure 14:
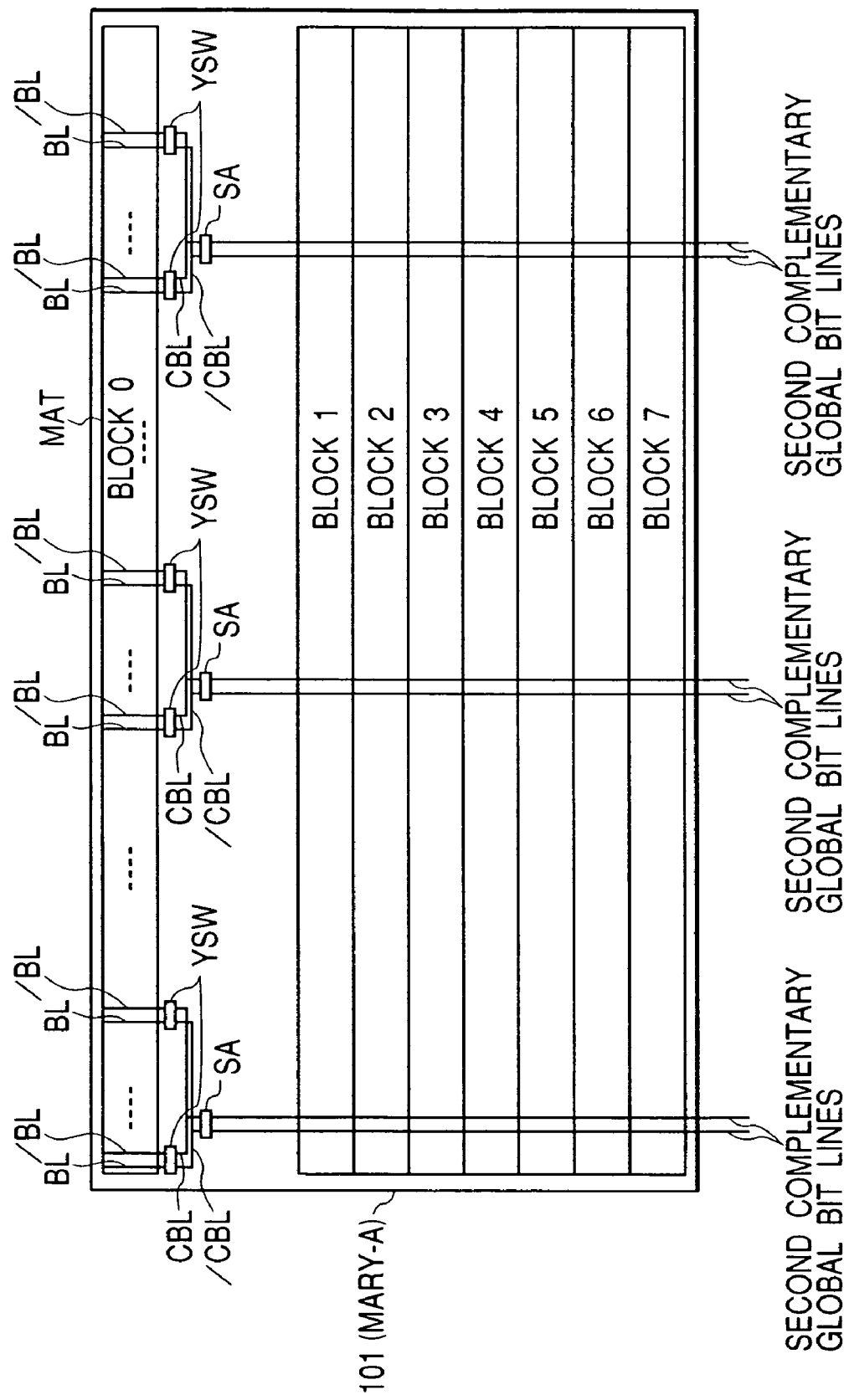
FIG. 14 is a block diagram of a memory cell array showing the wiring layout of a SRAM, which is another preferred embodiment of the invention.

FIG. 14 is a block diagram of a memory cell array showing the wiring layout in this preferred embodiment of the invention.

In this embodiment, the complementary second global bit lines (GBL and /GBL) are directly connected to the sense amplifier circuit (SA) 105 for amplifying data read out of the memory cell MC via the complementary bit lines (BL and /BL).

As the second complementary global bit lines (GBL and /GBL) are connected at every I/O block of each MAT (MAT) according to this system, the first complementary global bit lines (GBL and /GBL) extending in the row direction can be dispensed with though the number of second complementary global bit lines (GBL and /GBL) increases, and the area of the wiring channels can be compressed correspondingly, so that the chip area can be further reduced, and so can be the length of access time.

Embodiment 3

Figure 15:
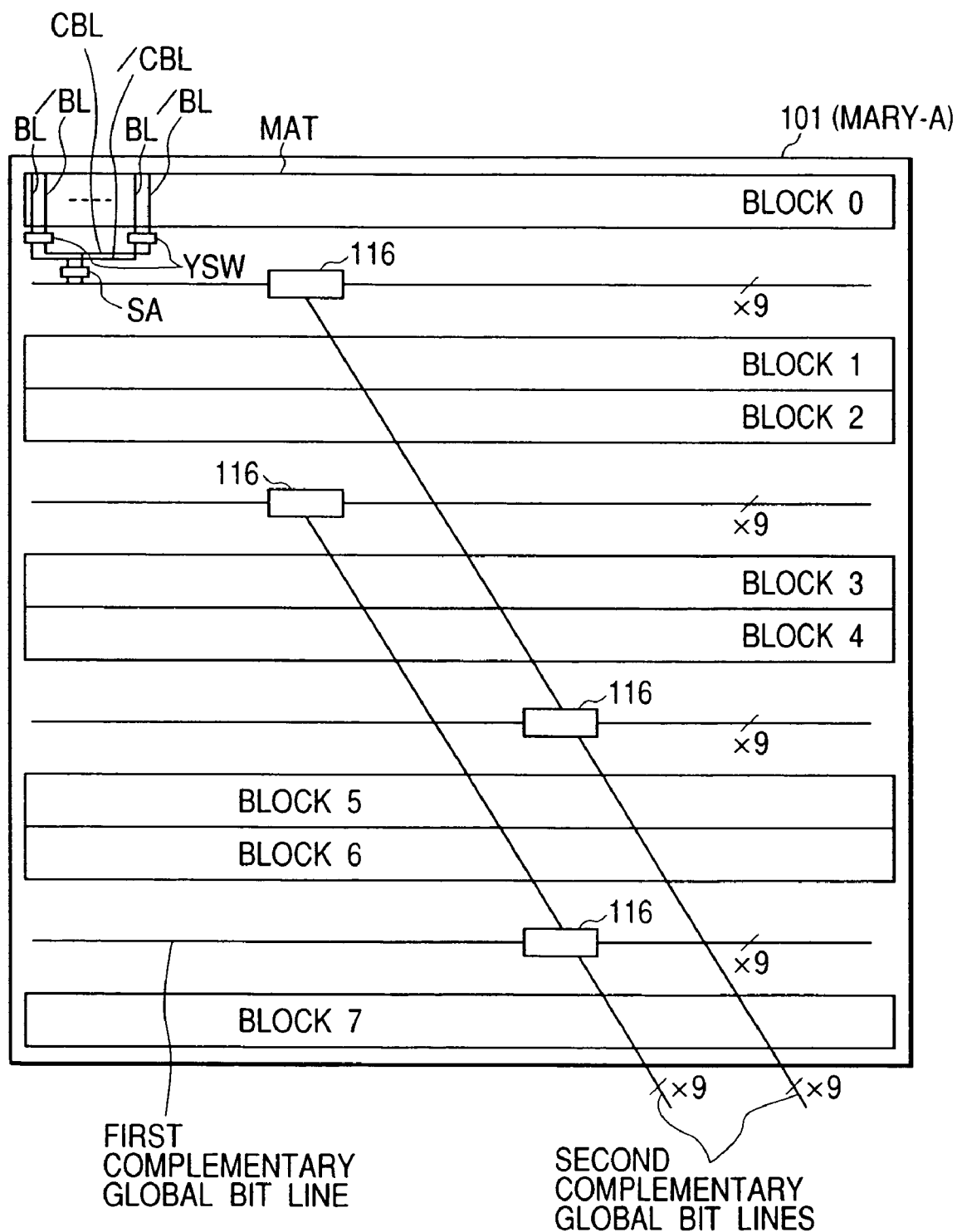
FIG. 15 is a block diagram of a memory cell array showing the wiring layout of a SRAM, which is another preferred embodiment of the invention.

FIG. 15 is a block diagram of a memory cell array showing the wiring layout in this preferred embodiment of the invention.

In this embodiment, wiring obliquely crosses second complementary global bit lines (GBL and /GBL) over the memory cell array. As this serves to reduce the parasitic capacitances between the complementary global bit lines (GBL and /GBL) and the complementary bit lines (BL and /BL), it is made possible to prevent the bit lines from being adversely affected and erroneous actions from occurring.

Embodiment 4

Figure 16:
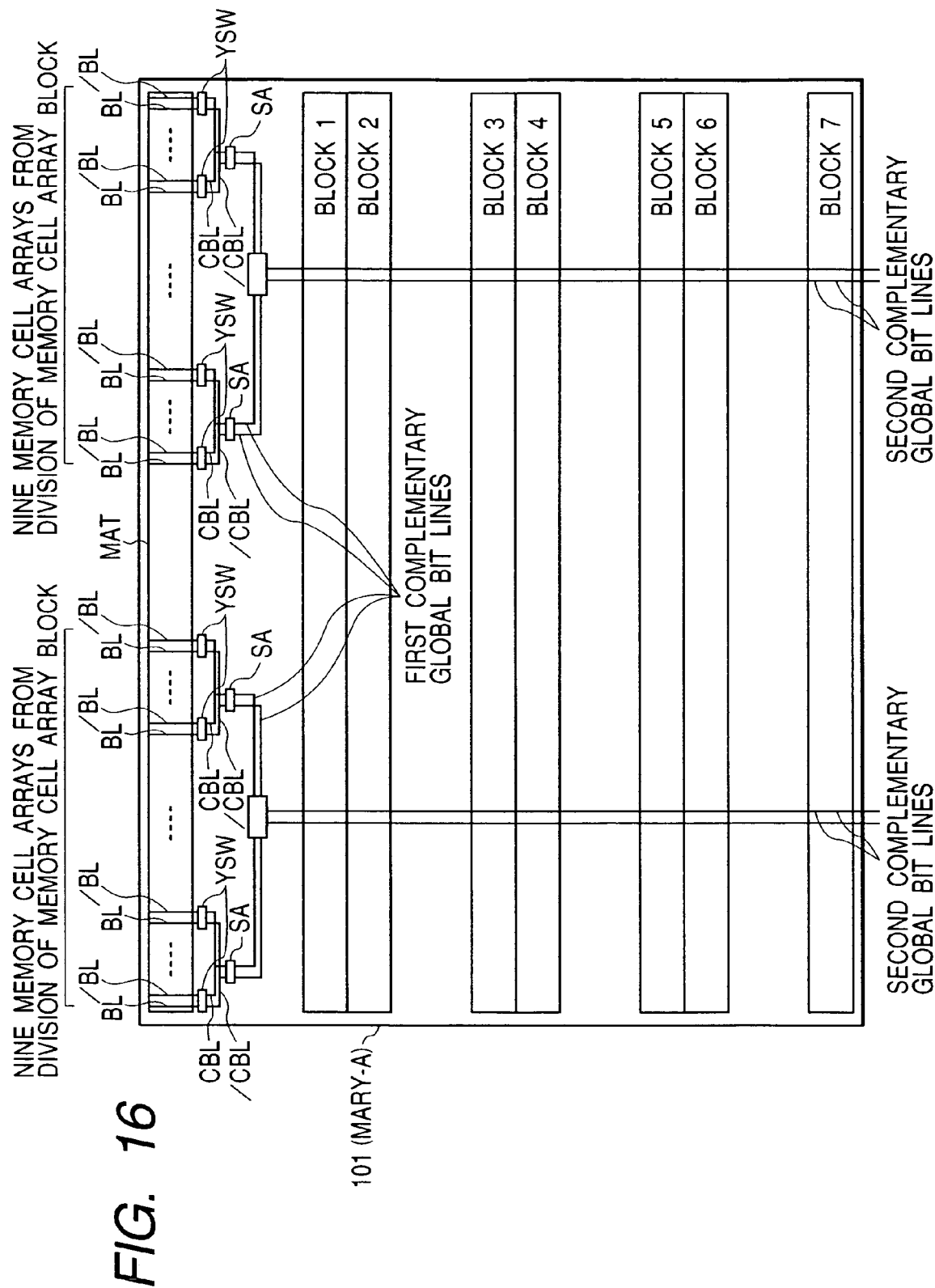
FIG. 16 is a block diagram of a memory cell array showing the wiring layout of a SRAM, which is another preferred embodiment of the invention.

FIG. 16 is a block diagram of a memory cell array showing the wiring layout in this preferred embodiment of the invention.

In this embodiment, memory cells MC sharing the same I/O are arranged close to each other. As this arrangement serves to shorten the wiring length of first complementary global bit lines (GBL and /GBL) extending in the row direction, signal delays are reduced, and it is made possible to read out data at higher speed.

Embodiment 5

Regarding this embodiment, an effective layout of peripheral circuits where the second complementary global bit lines (GBL and /GBL) are arranged over the memory cell array will be described.

Figure 17:
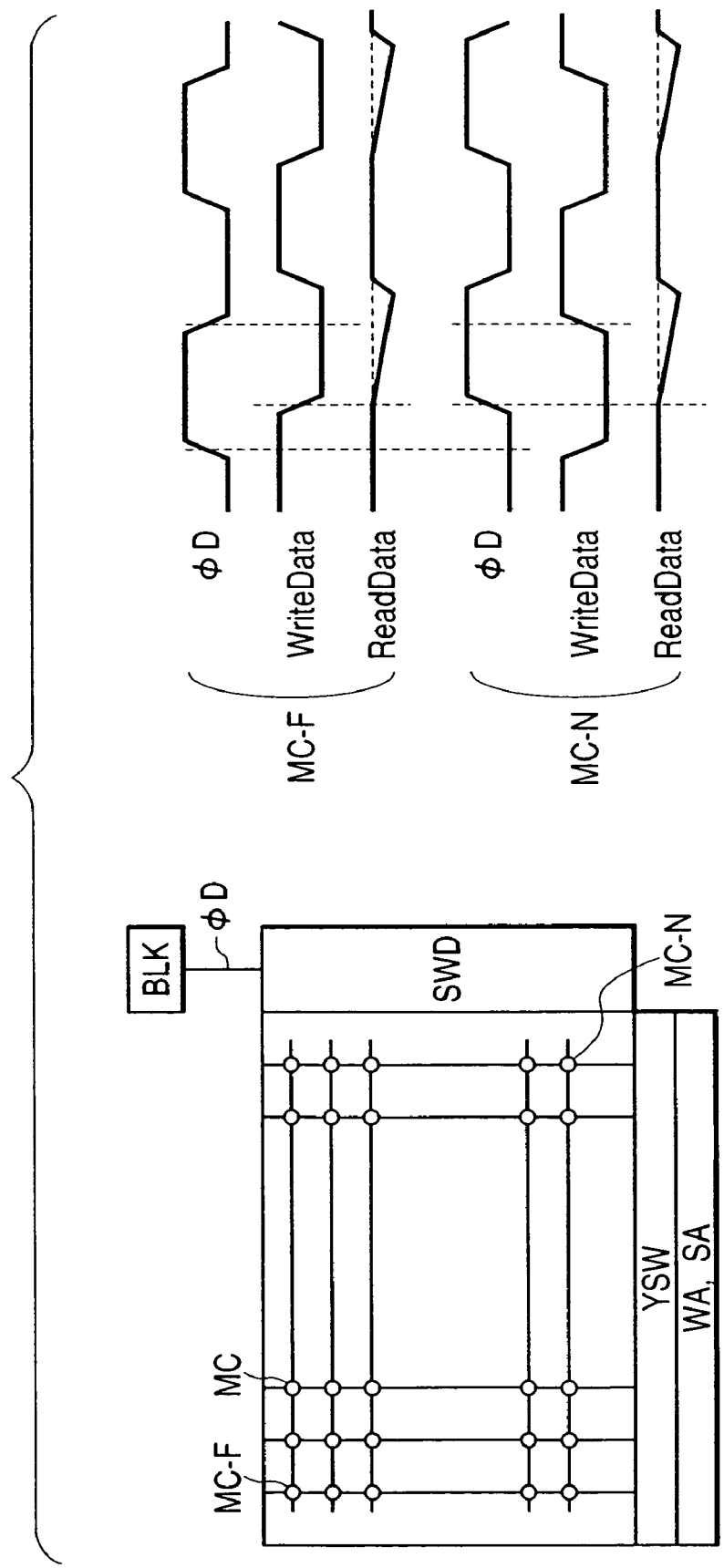
FIG. 17 is a block diagram of a memory cell array showing the layout of peripheral circuits to a SRAM, which is another preferred embodiment of the invention.

FIG. 17 illustrates a case in which the sense amplifier circuit (SA) and the write amplifier circuit (WA) are arranged on the same side of the memory cell array, and the sense amplifier circuit (SA) and the decode signal are arranged on different sides from each other.

This layout has an advantage of achieving a high speed of reading data out at the time of READ. However, as write data and the decode signal are on different sides from each other at the time of WRITE, there arises a timing lag between the write data and the decode signal. This results in a disadvantage that, if a long enough period is to be secured for writing the write data, the cycle time cannot be shortened.

Figure 18:
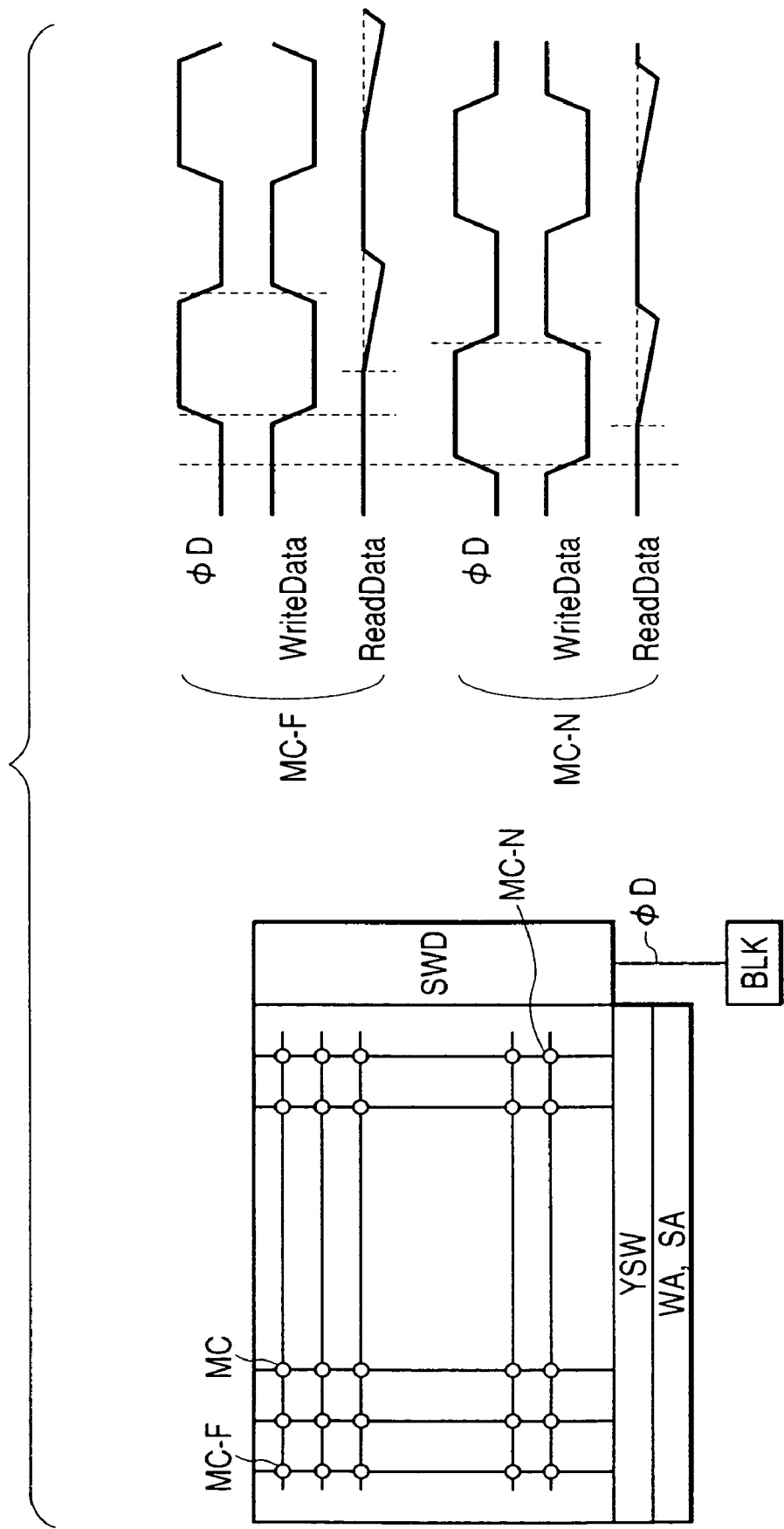
FIG. 18 is a block diagram of a memory cell array showing the layout of peripheral circuits to a SRAM, which is another preferred embodiment of the invention.

FIG. 18 illustrates a case in which the sense amplifier circuit (SA), the write amplifier circuit (WA) and the decode signal are arranged on the same side of the memory cell array.

This layout has an advantage of allowing the minimization of the cycle time because a timing lag hardly arises between the write data and the decode signal. At the same time, there is a disadvantage that, when a memory cell on the farther side is to be accessed, the delay is increased because both the decode signal and the READ data signal have to pass a wiring length equivalent to the memory cell array.

Figure 19:
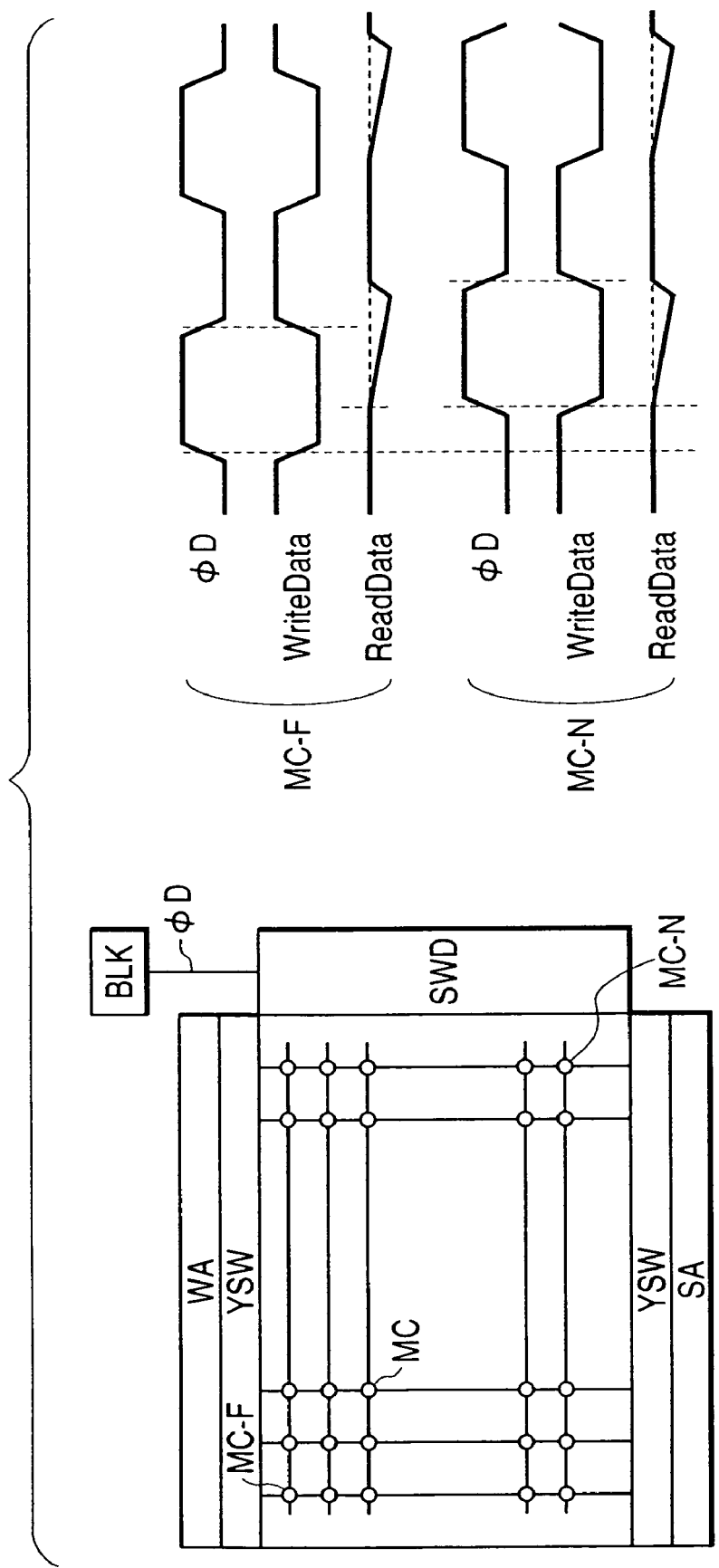
FIG. 19 is a block diagram of a memory cell array showing the layout of peripheral circuits to a SRAM, which is another preferred embodiment of the invention.

FIG. 19 illustrates a case in which the sense amplifier circuit (SA) and the write amplifier circuit (WA) are arranged on different sides of the memory cell array, and the write amplifier circuit (WA) and the decode signal are arranged on the same side.

This layout has an advantage of shortening the cycle time and the access time at the time of READ because the disadvantages of the foregoing two layouts can be obviated. At the same time, it has a disadvantage that two Y select circuits (YSW) 103, one for READ and the other for WRITE, have to be arranged.

Whereas the invention achieved by the present inventor has been described in specific terms with reference to the preferred embodiments thereof, obviously the invention is not confined to these embodiments but can be modified in various ways without deviating from the essentials thereof.

Although the embodiments described above are cases in which the invention is applied to SRAMs, the invention is not confined to these cases, but can be extensively applied to memory LSIs including DRAMs.

A typical aspect of the invention disclosed in this application is briefly summed up below.

According to the invention, as it is possible reduce parasitic capacitances formed between bit lines by way of which signals are read out of memory cells and signal transmission lines arranged above them, the chip area of the semiconductor memory device, and accordingly its manufacturing cost, can be reduced.

What is claimed is:

1. A memory device formed on a semiconductor substrate, comprising:
    a plurality of word lines;
    a plurality of pairs of bit lines;
    a plurality of memory cells coupled with the plurality of word lines and the plurality of pairs of bit lines;
    a plurality of amplifiers coupled with the plurality of pairs of bit lines and amplifying signals on the plurality of pairs of bit lines;
    a plurality of first signal transmission lines coupled with the plurality of amplifiers and transmitting the amplified signals;
    a plurality of buffer circuits coupled with the plurality of first signal transmission lines; and
    a plurality of second signal transmission lines coupled with the plurality of buffer circuits and transmitting signals via the buffer circuits,
    wherein the plurality of pairs of bit lines is formed in a first layer on a main surface of the semiconductor substrate and is arranged to extend in a first direction of the main face,
    wherein the plurality of first signal transmission lines is formed in a second layer positioned above the first layer and is arranged to extend in the first direction,
    wherein the plurality of second signal transmission lines is formed in a third layer positioned above the first layer and the second layer and is arranged to extend in a second direction different from the first direction, and
    wherein a part of the plurality of second signal transmission lines which is not arranged over the first signal transmission lines is not arranged in parallel with the first signal transmission lines, and
    wherein a part of the second signal transmission lines which is not arranged over the first signal transmission lines does not cross at right angles with the first signal transmission lines.

2. The memory device formed on a semiconductor substrate according to claim 1,
    wherein the memory device is a static random access memory device.

3. The memory device formed on a semiconductor substrate according to claim 1,
    wherein the memory device is a dynamic random access memory device.

* * * * *